United States Patent [19]

Simeau

[11] 4,207,480
[45] Jun. 10, 1980

[54] D.C. AMPLIFIER WITH IMPROVED CHARACTERISTICS WITH RESPECT TO TEMPERATURE

[75] Inventor: Bernard J. Simeau, Le Puy, France

[73] Assignee: Constructions Electriques, R.V., Le Puy, France

[21] Appl. No.: 913,338

[22] Filed: Jun. 7, 1978

[30] Foreign Application Priority Data

Jun. 16, 1977 [FR] France .................. 77 18481

[51] Int. Cl.² .................. H01H 37/32; H03F 3/04
[52] U.S. Cl. .................. 307/308; 330/296; 330/298; 330/311
[58] Field of Search .................. 330/207 P, 289, 296, 330/298; 307/311, 300, 308

[56] References Cited

U.S. PATENT DOCUMENTS 3,868,581  2/1975  Ahmed .................. 330/289

FOREIGN PATENT DOCUMENTS 495748  3/1976  U.S.S.R. .................. 330/298

OTHER PUBLICATIONS

*Elektor*, vol. 2, No. 7-8, p. 746, Jul.-Aug., 1976.

Primary Examiner—James B. Mullins
Attorney, Agent, or Firm—Lane, Aitken & Ziems

[57] ABSTRACT

A D.C. amplifier for low-level currents includes an input stage having first and second cascode mounted transistors and a bis circuit adapted to maintain the base and collector potentials of the first transistor very close to each other over a predetermined temperature range. The amplifier is particularly suited for use in a flame detection device and, in addition, may include a protection circuit for the base-emitter junction of the first transistor.

7 Claims, 6 Drawing Figures

D.C. AMPLIFIER WITH IMPROVED CHARACTERISTICS WITH RESPECT TO TEMPERATURE

The present invention concerns a D.C. amplifier, particularly for very low strength currents, applicable, in particular but not exclusively, to flame detection devices using the conducting properties of flames, which are now widely used.

Such devices are used principally to condition the operation of an electric spark igniter to the absence of a flame, in other words to condition the stopping of the production of sparks to the presence of a flame.

They may also be used for providing safety functions, the absence of a flame then leading to a state of safety in which the gas supply to the controlled burner is interrupted out.

Different circuits, supplied by an electrical distribution network, have been proposed for this purpose, whose performances—satisfactory—are characterised by a range of operating temperatures from $-30$ to $+80°$ C. and by an ability to detect low-power flames (flames of pilot burners), whose electrical resistance reaches 50 M$\Omega$.

If we now envisage supplying such a device, not from the voltage—high—distributed by the network, but from sources such as dry cells or batteries delivering a relatively low voltage, obtaining the characteristics set forth above presents unquestionable difficulties.

The field of application of such low-voltage fed devices is very wide and covers for example auxiliary heating by mobile radiators; the heating of vehicles (cabin or engine); the heating, the cooking, the production of hot water on board different vehicles; mobile cooking apparatus (portable stoves, barbecues etc.).

The difficulties met with for obtaining satisfactory performances come from the very small currents transmitted by the flame (e.g. 0.1 $\mu$A for a flame resistance of 50 M$\Omega$ detected with a voltage of 5V), as well as from the normal operating temperatures met with, 80° C. or even 100° C. for compact mobile apparatus.

At such temperatures, the leakage currents of the usual semi-conductors, used to provide the necessary amplification function, are in fact much higher than the small currents to be amplified, e.g. 2 $\mu$A at 100° C. for a silicon semi-conductor having a leakage current of 15 nA at room temperature.

The possible expedients are then:

either to limit the range of operating temperatures to, for example, 50° C.;

or to limit the detecting ability to low resistance flames (of the order of 2M$\Psi$) and so of high power, which excludes the detection of pilot burner flames;

or to select semi-conductors used for very low leakage currents, which however leads to a very rapid increase in their cost;

or finally to combine together these different expedients so as to solve very precise and limited cases of use.

The principal aim of the present invention is to provide a DC current amplifier arrangement adapted to amplify the low strength currents met with, without the counterpart of the usual limitations resulting from operation at high temperatures, this by using semi-conductors having ordinary characteristics and so economical.

To do this, a DC amplifier in accordance with the invention is characterised in that it comprises as input stage a first and a second bipolar transistors mounted in cascode, said stage comprising a bias circuit adapted to maintain, at least in a certain range of temperatures, the potentials of the base and of the collector of said first transistor very close to one another.

Thus, we can cancel out or considerably reduce the influence of the troublesome parameter likely to upset the operation of the amplifier at high temperatures, which is the collector-base leakage current of the input transistor (first transistor), this while obtaining a cancellation or a considerable reduction of this leakage current, by a cancellation or a considerable reduction of the voltage difference between the collector and the base of this transistor.

The invention may be implemented in many ways, and said bias circuit may take different forms, and be formed for example by two resistors forming a supply voltage divider, whose common point is connected to the base of the second transistor of the cascode stage.

However, it will be very advantageous to provide in general for said bias circuit to be adapted to supply to the base of said second transistor a bias voltage whose law of variation with respect to the temperature is very close to the law of variation, with respect to the temperature, of the algebraic sum of the base-emitter voltages of said first and second transistors.

This arrangement will allow a reduction or cancellation of said leakage current of the first transistor to be obtained over a wide range of temperatures.

For this, it may be arranged, in a practical embodiment, and when said first and second transistors of the cascode stage have the same polarity, for said bias circuit to comprise two series diodes forwardly biased by a DC current, disposed between the emitter of the first transistor and the base of the second.

In fact, the voltages at the junctions of the silicon semi-conductors, in the case in point the base-emitter voltages of the first and second transistors, are assigned a temperature coefficient of the order of $-2.2$ mV/°C., so that without temperature compensation of the bias voltage, the collector-base voltage of said first transistor would be assigned a temperature coefficient of the order of 4.4 mV/°C., and would only be cancelled out for a single temperature.

The fact that the bias circuit comprises two diodes mounted in the above-mentioned fashion (each having a direct voltage variation with a temperature coefficient of the order of $-2.2$ mV/°C.) will allow a very low residual value to be obtained of the temperature coefficient for the collector-base voltage of the first transistor, and so a cancelling out of this voltage over a wide range of temperatures.

The use of such diodes presents moreover other advantages, which will be explained hereafter.

Another aim of the invention, particularly when the base-emitter junction of the first transistor is likely to be subjected to reverse voltage overloading, as may be the case when the amplifier is situated close to a high voltage ignition generator (e.g. 15 kV), and when the functional connections with this latter constitute risks of heavy, possibly destructive overloading, is to provide protection means against such overloading.

To this end, an amplifier in accordance with the invention may further be characterised in that it comprises a protection circuit comprising at least a first semi-conductor diode one connection of which is connected to the base of the first transistor and whose other connection is maintained at a potential very close to that of this base, this first diode being orientated reversely of the base-emitter junction of said first transistor.

Said first diode will thus limit the reverse voltage deviation of the potential of the base of said first transistor to a non dangerous value.

Here again, the invention may be implemented in many ways.

The amplifier may thus be further characterised in that said other connection of said first protection diode is connected to the collector of said first transistor, the continuity of said protection circuit being ensured by a second semi-conductor diode having the same orientation as the first, connected between the collector and the emitter of the first transistor.

This other solution will have the advantage of not superimposing on the small input current to be amplified, leaks of said first diode, subjected to the reverse base-emitter voltage of said first transistor. As for the second diode, it will have the role of absorbing the excessive reverse voltages at the collector of this first transistor.

According to another embodiment, still with the same end in view, and when said first and second transistors of the cascode stage are of the same polarity, it may be arranged for said other connection of said first protection diode to be connected to the collector of said first transistor, the continuity of said protection circuit being ensured, through the emitter-base junction of said second transistor, by a second semi-conductor diode having the same orientation as this junction, connected between the base of the second transistor and the emitter of the first.

In this case, the reverse overvoltages are absorbed through said first diode, the emitter-base junction of said second transistor of the cascade stage and said second diode.

According to yet another embodiment, when said bias circuit comprises two series diodes biased forwardly by a DC current, disposed between the emitter of the first transistor and the base of the second, it may still be arranged for said other connection of said first diode to be connected to the common point of both diodes of said biasing circuit, the continuity of said protection circuit being ensured by a second semi-conductor diode having the same orientation as the first, connected between said common point and the emitter of the first transistor.

In fact, the emitter-collector voltages of the first transistor and the base-emitter voltages of the second transistor are very close to one another and consequently the intermediate potential between the two diodes of the biasing circuit is very close to the base-emitter voltage of the first transistor.

Finally, and whatever the embodiment chosen, it will furthermore be advantageously arranged for said biasing circuit to be calculated so that the algebraic difference of the potentials between the base and the collector of said first transistor is maintained with a constant sign over a large range of temperatures covering the normal operating temperature range.

Thus, the sign of the collector-base leakage current of said first transistor may be controlled, which is the current disturbing the input current to be amplified.

The invention relates furthermore to the applications of the DC amplifiers such as defined above and concerns, in particular, a flame detection device of the kind making use of the conducting properties of flames, comprising an ignition spark generator adapted to be controlled by a control circuit supplying a signal representative of the presence or of the absence of a flame, so that said sparks may be produced only in the absence of a flame.

In accordance with the invention, such a device will be characterised in that said control circuit comprises a DC amplifier such as defined above, in one or other of its embodiments.

Different embodiments of the invention are described below by way of non limiting examples, with reference to the figures of the accompanying drawing in which.

Figure 1:
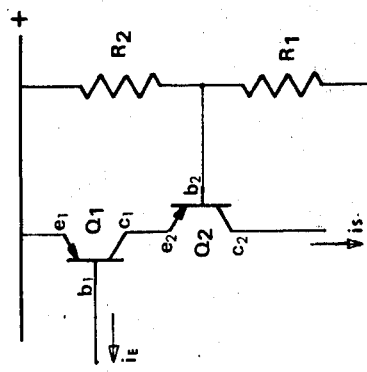
FIGS. 1 and 2 show the basic principle of the cascode mounted input stage of a DC amplifier in accordance with the invention.

In FIG. 1 there is shown the input stage of a DC amplifier in accordance with the invention, this stage comprising two cascode mounted transistors Q1 and Q2, in a known way.

The voltage at the base b2 of the second transistor Q2 is fixed by a bias circuit having two resistors R1 and R2 calculated so that at the normal operating point the difference between the voltages Vb1-Vc1 of the first transistor Q1 is considerably reduced or cancelled out even.

Of course, in practice we cannot obtain exactly the ideal conditions for cancelling out the Vb1-Vc1 voltage of the first transistor Q1. However, we can obtain a reduction of the collector-base leakage current of the first transistor in a ratio of at least 10 for a voltage Vc1-b1 of a few tens of mV.

There may however be provided an adjustment of voltage Vb2, at the base of the second transistor Q2, so that the cancelling out of voltage Vc1-b1 is obtained close to the maximum operating limit temperature, which minimises the residual effects due to the temperature.

In fact, for silicon transistors Q1 and Q2, voltages Vb1-e1 and Vb2-e2 are assigned a temperature coefficient which, as pointed out above, is of the order of −2.2 mV/° C. so that said voltage Vc1-b1 is itself assigned a temperature coefficient of the order of 4.4 mV/° C., this voltage then only being cancelled out for a single temperature.

Figure 2:
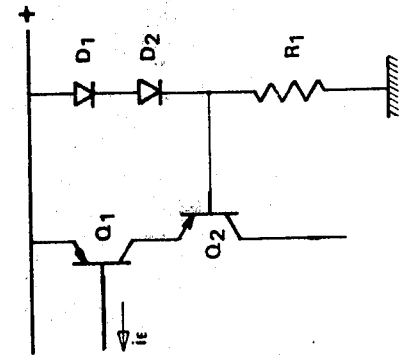

Taking this remark into account and so as to complete the result obtained, it will be particularly advantageous to replace resistor R2 by two semiconductor diodes D1 and D2 forwardly biased, as shown in FIG. 2.

Because of the temperature coefficient, also very close to 2.2 mV/° C., assigned to the forward voltages of these two diodes, there will be obtained a very small residual value of the temperature coefficient assigned to the Vc1-b1 voltage, which allows a considerable reduction of the leakage current of the first transistor Q1 to be obtained over a much wider range of temperatures.

It will be noted furthermore that by a judicious choice of the technology of manufacture of diodes D1 and D2 and, to a certain extent, by the choice of their bias current determined by resistor R1, it is possible to give to voltage Vc1-b1 any predetermined sign desired and accordingly to control the sign of the collector-base leakage current of the first transistor, which disturbs the input current to be amplified iE.

Thus, the behaviour of the amplifier will be controlled beyond its normal range of temperatures and a tendency either to cut-off or to saturation may be provided in consideration of the type of application in which the amplifier is used.

Another important advantage of the circuit of FIG. 2 is that the base voltage $Vb2$ of transistor Q2 will be much less affected by variations of the supply voltage than it would have been if it had been provided by the resistor bridge of FIG. 1.

Such a circuit is thus adapted to be used with a widely variable supply voltage, as is the case with dry cells at the end of their use, without greatly disturbing its properties.

An amplifier in accordance with the invention may find a very advantageous application in a flame detection device of the kind making use of the conducting properties of flames, comprising an ignition spark generator adapted to be controlled by a control circuit able to supply a signal representative of the presence or of the absence of a flame, so that said sparks may be produced only in the absence of a flame.

Figure 3:
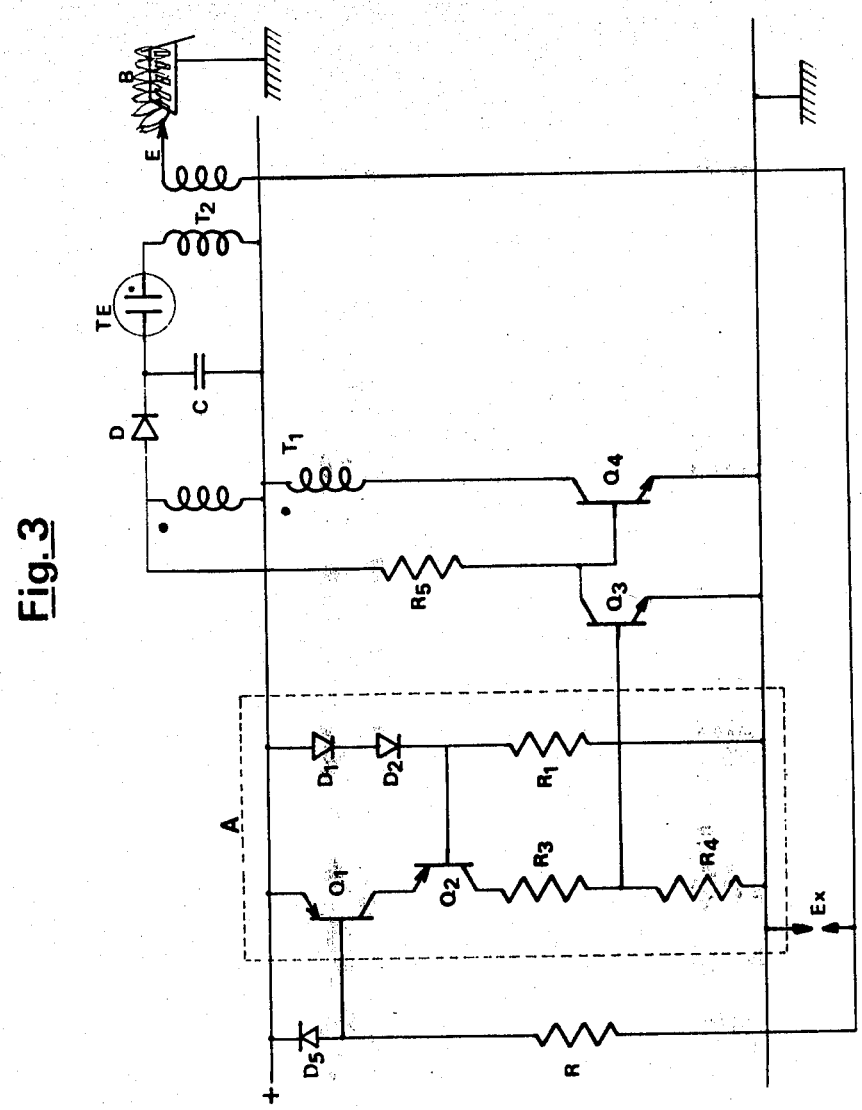
FIG. 3 shows a possible use of such an amplifier in a gas ignition high voltage pulse generator.

Such a device is shown by way of example in FIG. 3.

In such a device, the ignition electrode may be placed close to the conduction flame detection electrode, even to be merged therewith.

In FIG. 3 there is shown generally at A, within a dashed line frame, an amplifier in accordance with the invention, used as control circuit in an ignition spark generator, comprising an oscillator, it being arranged that the oscillator is disabled, under the action of said control circuit, as soon as a flame is present.

For this purpose, the output signal of amplifier A, taken at the common point of two resistors R3 and R4 connected to the collector of the second transistor Q2, is fed to the base of a transistor Q4 through a transistor Q3. The oscillator properly speaking is formed by this transistor Q4, to the collector of which is connected the primary of a transformer T1, whose secondary is connected to the common point between the collector of transistor Q3 and the base of transistor Q4 through a resistor R5 determining the feed-back current.

The output voltage of the oscillator, obtained at said secondary, is rectified by a diode D and fed to a high voltage ignition pulse generator formed, in a known way, by a capacitor C, a gas discharge tube TE and a voltage booster transformer T2.

The high voltage ignition pulses, appearing at the secondary of transformer T2, are applied to an ignition electrode E placed close to a gas burner B. The other end of the secondary winding of transformer T2 is connected to earth through an auxiliary spark gap Ex whose role, also in a known way, is to provide the galvanic insulation in relation to earth, of the assembly electrically conncted to the ignition electrode, without preventing ignition sparks from passing. The circuit for producing sparks is completed through the body of burner B, itself connected to electrical earth.

The ignition electrode E is plunged into the flame of the burner; it is moreover connected, through a high value resistor R (several megohms), to the base of the first transistor Q1 of amplifier A. In the presence of a flame, a current is thus established from the input of amplifier A to earth, through the ionised medium of the flame.

In the presence of ignition sparks, a large pulse voltage (several kilovolts) appears at the terminals of the auxiliary spark gap Ex and is applied, through resistor R, to the base of transistor Q1 of amplifier A.

Although of limited effect because of the high value of resistor R, this voltage is capable of destroying transistor Q1, particularly by reverse voltage breakdown of its base-emitter junction. This is why a protection diode D5 connected between the base and the emitter of transistor Q1 limits the voltage deviation of the base voltage to a non-dangerous value. With the opposite polarity, the base-emitter junction of transistor Q1 is capable of supporting the current limited by resistor R.

Other arrangements, e.g. making use of capacitors, may be proposed or used together with the arrangement of FIG. 3, with a galvanic conducting path established between the input of the amplifier and an electrode plunged into the flame of the burner.

Taking into account the presence in the ignition spark of extremely violent transients against which it is necessary to protect the input transistor of the amplifier, the protection provided by diode D5 forms a very efficient solution.

It presents however the disadvantage of superimposing the leaks of this diode, under the reverse voltage $Vb1-e1$, the input voltage of the transistor Q1, on the low input currents to be amplified.

Figure 4:
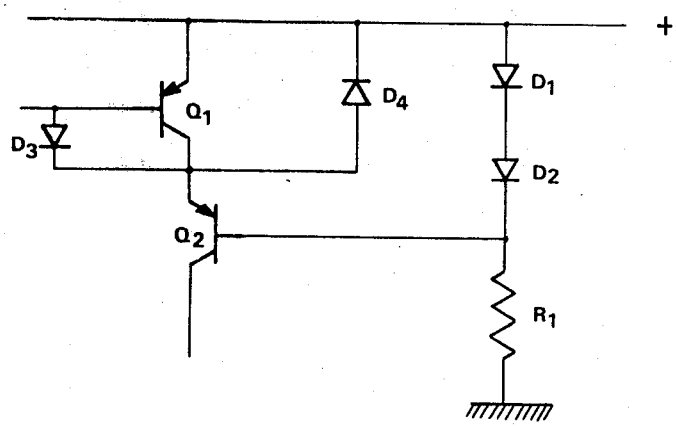
FIGS. 4 to 6 show different embodiments of protection circuits for the input transistor of an amplifier in accordance with the invention.

The same solution proposed for reducing the collector-base leaks of transistor Q1 may be applied by connecting the cathode of a first diode D3 to the collector of transistor Q1, the excessive positive voltages then being absorbed by a second diode D4 connecting this point to the positive supply voltage (FIG. 4).

Figure 5:
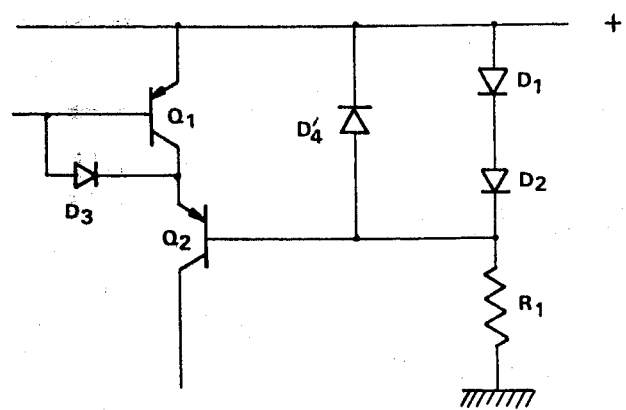

FIG. 5 shows a positional variation of the second diode, in which the positive overvoltages are absorbed through diode D3, the emitter-base junction of transistor Q2 and a second diode D'4 connected between the base of the second transistor Q2 and the emitter of the first transistor Q1.

Figure 6:
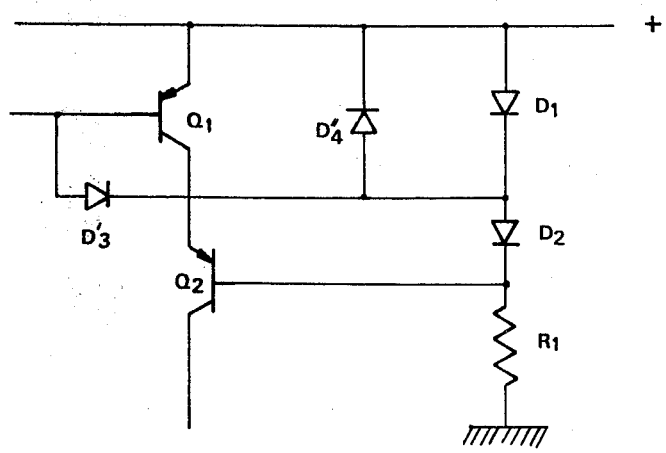

If we note that the voltages $Ve1-c1$ and $Vb2-e2$ are substantially equal and so that the intermediate potential between diodes D1 and D2 is very close to the voltage $Vb1-e1$ of transistor Q1, FIG. 6 gives another positional variation of the first protection diode D'3, connected between the base of the first transistor Q1 and the common point of two diodes D1 and D2, the positive overvoltages being absorbed through a second diode D"4, connected between this same common point and the emitter of transistor Q1.

Of course, other variations may be imagined, from the preceding description, without departing from the spirit of the invention.

Thus, there may of course be used either PNP transistors or NPN transistors, to form the input cascode stage, but it will in general be preferable to choose the PNP transistors for, to obtain the preferential conduction conditions in the ionised medium of the flame, it is desirable that electrode E be subjected to a positive supply voltage.

In particular, the solutions proposed lend themselves remarkably well to "integrated circuit" technology construction, the results obtained being all the better since the homogeneity of the temperatures of the different components is much better achieved with this technique than with discrete components.

I claim:

1. A flame detection device of the type responsive to the conducting properties of flames, said device comprising an ignition spark generator adapted to be controlled by a control circuit able to supply a signal indicative of the presence or of the absence of a flame, so that said sparks may only be produced in the absence of a flame, wherein said control circuit comprises a D.C. amplifier having an input stage that includes first and second cascode mounted bipolar transistors of the same polarity, said first transistor being common emitter connected and its base constituting the input connection of said amplifier, a bias circuit adapted to supply a bias voltage to the base of said second transistor, said bias circuit including two series connected diodes forwardly biased by a direct current, said diodes connected between the emitter of said first transistor and said base of said second transistor so that the variation of said bias voltage with respect to temperature is substantially the same as the variation with temperature of the algebraic sum of the base-emitter voltages of said first and second transistors whereby the potentials of said base and of the collector of said first transistor are maintained substantially the same as one another over a selected temperature range, and an overload protection circuit for protecting the base-emitter junction of said first transistor from reverse voltage overloading, said protection circuit including at least a first semi-conductor protection diode having one connection thereof connected to said base of said first transistor and the other connection thereof maintained at a potential substantially the same as said base of said first transistor, said first diode oriented reversely to said base-emitter junction of said first transistor.

2. A device according to claim 1, characterised in that the transistors of the cascode circuit of the input stage are PNP transistors.

3. A D. C. amplifier for amplifying low level current, comprising an input stage having first and second cascode mounted bipolar transistors of the same polarity, said first transistor being common emitter connected and its base constituting the input connection of said amplifier, a bias circuit adapted to supply a bias voltage to the base of said second transistor, said bias circuit including two series connected diodes forwardly biased by a direct current, said diodes connected between the emitter of said first transistor and said base of said second transistor so that the variation of said bias voltage with respect to temperature is substantially the same as the variation with temperature of the algebraic sum of the base-emitter voltages of said first and second transistors whereby the potentials of said base and of the collector of said first transistor are maintained substantially the same as one another over a selected temperature range, and an overload protection circuit for protecting the base-emitter junction of said first transistor from reverse voltage overloading, said protection circuit including at least a first semi-conductor protection diode having one connection thereof connected to said base of said first transistor and the other connection thereof maintained at a potential substantially the same as said base of said first transistor, said first diode oriented reversely to said base-emitter junction of said first transistor.

4. The amplifier claimed in claim 3 wherein said other connection of said first protection diode is connected to the collector of said first transistor, the continuity of said protection circuit provided by a second semi-conductor diode having the same orientation as said first semiconductor diode, said second semi-conductor diode connected between the collector and the emitter of said first transistor.

5. The amplifier claimed in claim 3 in which said other connection of said first protection diode is connected to the collector of said first transistor, the continuity of said protection circuit being provided, through the emitter-base junction of said second transistor, by a second semi-conductor diode having the same orientation as said emitter-base junction of said second transistor and connected between the base of said second transistor and the emitter of said first transistor.

6. The amplifier claimed in claim 3 wherein said other connection of said first diode is connected to the common point of said two diodes of said bias circuit, the continuity of said protection circuit being provided by a second semiconductor diode having the same orientation as said first semi-conductor diode, connected between said common point and the emitter of said first transistor.

7. An amplifier according to claim 3 wherein said bias circuit is calculated so that the algebraic difference of the potentials between the base and the collector of said first transistor is maintained with a constant sign over a wide range of temperatures including the normal operating temperature range of said ampliifer.

* * * * *

UNITED STATES PATENT AND TRADEMARK OFFICE
CERTIFICATE OF CORRECTION

PATENT NO. : 4,207,480
DATED : June 10, 1980
INVENTOR(S) : Bernard J. Simeau

It is certified that error appears in the above—identified patent and that said Letters Patent is hereby corrected as shown below:

Column "ABSTRACT" "bis" should have read -- bias --;

Column 1, line 18, "out" should have been deleted;

Column 1, line 53, "$\Psi$" should have read --$\Omega$ --.

Column 4, line 40, "minimises" should read -- minimizes --;

Column 5, line 56, "conncted" should read -- connected --.

Signed and Sealed this

Nineteenth Day of August 1980

[SEAL]

Attest:

SIDNEY A. DIAMOND

Attesting Officer

Commissioner of Patents and Trademarks